(12) United States Patent  
Chen et al.

(10) Patent No.: US 9,224,680 B2  
(45) Date of Patent: *Dec. 29, 2015

(54) ELECTRICAL CONNECTIONS FOR CHIP SCALE PACKAGING

(71) Applicant: Taiwan Semiconductor Manufacturing Company, Ltd., Hsin-Chu (TW)

(72) Inventors: Hsien-Wei Chen, Hsin-Chu (TW); Shih-Wei Liang, Dajia Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/571,068

(22) Filed: Dec. 15, 2014

(65) Prior Publication Data

US 2015/0097287 A1    Apr. 9, 2015

Related U.S. Application Data

(63) Continuation of application No. 13/410,195, filed on Mar. 1, 2012, now Pat. No. 8,912,668.

(51) Int. Cl.
*H01L 23/48* (2006.01)
*H01L 23/52* (2006.01)
(Continued)

(52) U.S. Cl.
CPC ........ *H01L 23/49833* (2013.01); *H01L 21/311* (2013.01); *H01L 21/481* (2013.01); *H01L 21/486* (2013.01); *H01L 21/4857* (2013.01); *H01L 23/49816* (2013.01); *H01L 23/49827* (2013.01); *H01L 23/49838* (2013.01); *H01L 24/05* (2013.01); *H01L 24/06* (2013.01); *H01L 24/14* (2013.01); *H01L 23/3192* (2013.01); *H01L 24/13* (2013.01); *H01L 2224/0345* (2013.01); *H01L 2224/0346* (2013.01); *H01L 2224/03452* (2013.01); *H01L 2224/0401* (2013.01); *H01L 2224/05008* (2013.01);
(Continued)

(58) Field of Classification Search
CPC ........... H01L 2224/05017; H01L 2224/05018; H01L 2224/05022; H01L 2224/06131
USPC ........... 257/784, 758, 781, 750; 438/613, 614
See application file for complete search history.

(56) References Cited

U.S. PATENT DOCUMENTS 5,859,474 A    1/1999 Dordi
6,181,569 B1    1/2001 Chakravorty
(Continued)

FOREIGN PATENT DOCUMENTS

CN    101582406    11/2009
CN    101636831    1/2010
(Continued)

*Primary Examiner* — S. V. Clark
(74) *Attorney, Agent, or Firm* — Slater & Matsil, L.L.P.

(57) ABSTRACT

Electrical connections for chip scale packaging are disclosed. In one embodiment, a semiconductor device includes a post-passivation layer disposed over a substrate, the substrate having a first direction of coefficient of thermal expansion mismatch. The semiconductor device includes a first opening through the post-passivation layer, the first opening comprising a plurality of elongated apertures. A longest of the plurality of elongated apertures comprises a first dimension, wherein the first dimension is aligned substantially perpendicular to the first direction of coefficient of thermal expansion mismatch.

20 Claims, 7 Drawing Sheets

(51) Int. Cl.
- *H01L 29/40* (2006.01)
- *H01L 23/498* (2006.01)
- *H01L 23/00* (2006.01)
- *H01L 21/311* (2006.01)
- *H01L 21/48* (2006.01)
- *H01L 23/31* (2006.01)

(52) U.S. Cl.
CPC ........... *H01L 2224/05012* (2013.01); *H01L 2224/05017* (2013.01); *H01L 2224/05018* (2013.01); *H01L 2224/05022* (2013.01); *H01L 2224/05124* (2013.01); *H01L 2224/05147* (2013.01); *H01L 2224/05569* (2013.01); *H01L 2224/05644* (2013.01); *H01L 2224/05647* (2013.01); *H01L 2224/061* (2013.01); *H01L 2224/06131* (2013.01); *H01L 2224/1145* (2013.01); *H01L 2224/11334* (2013.01); *H01L 2224/11462* (2013.01); *H01L 2224/11849* (2013.01); *H01L 2224/13111* (2013.01); *H01L 2224/13139* (2013.01); *H01L 2224/13147* (2013.01); *H01L 2924/00014* (2013.01); *H01L 2924/351* (2013.01)

(56) References Cited

U.S. PATENT DOCUMENTS

| | | |
|---|---|---|
| 6,268,568 B1 | 7/2001 | Kim |
| 6,294,840 B1 | 9/2001 | McCormick |
| 6,339,534 B1 | 1/2002 | Coico et al. |
| 6,774,474 B1 | 8/2004 | Caletka et al. |
| 6,841,853 B2 | 1/2005 | Yamada |
| 6,841,875 B2 | 1/2005 | Ohsumi |
| 6,864,565 B1 | 3/2005 | Hool et al. |
| 6,913,948 B2 | 7/2005 | Caletka et al. |
| 6,927,498 B2 | 8/2005 | Huang et al. |
| 6,998,532 B2 | 2/2006 | Kawamoto et al. |
| 7,125,748 B2 | 10/2006 | Grigg et al. |
| 7,160,805 B1 | 1/2007 | Burke et al. |
| 7,397,121 B2 | 7/2008 | Chou et al. |
| 7,408,260 B2 | 8/2008 | Fjelstad et al. |
| 7,550,837 B2 | 6/2009 | Kimura et al. |
| 7,638,881 B2 | 12/2009 | Chang et al. |
| 7,863,742 B2 | 1/2011 | Yu et al. |
| 7,872,344 B2 | 1/2011 | Fjelstad et al. |
| 7,893,524 B2 | 2/2011 | Sunohara et al. |
| 7,934,313 B1 | 5/2011 | Lin et al. |
| 8,084,871 B2 | 12/2011 | Rahim et al. |
| 8,119,927 B2 | 2/2012 | Yoda et al. |
| 8,227,926 B2 | 7/2012 | Topacio et al. |
| 8,232,641 B2 | 7/2012 | Ozawa et al. |
| 8,324,740 B2 | 12/2012 | Hagihara |
| 8,405,211 B2 | 3/2013 | Tsai et al. |
| 8,445,355 B2 | 5/2013 | Abou-Khalil et al. |
| 8,624,392 B2 | 1/2014 | Yew et al. |
| 8,829,673 B2 | 9/2014 | Cha et al. |
| 8,912,668 B2 * | 12/2014 | Chen et al. ............ 257/784 |
| 2002/0155637 A1 | 10/2002 | Lee |
| 2002/0164836 A1 | 11/2002 | Ho |
| 2003/0151140 A1 | 8/2003 | Nishiyama et al. |
| 2003/0227025 A1 | 12/2003 | Ochi et al. |
| 2004/0026782 A1 | 2/2004 | Anzai |
| 2004/0125577 A1 | 7/2004 | Vinciarelli et al. |
| 2004/0132230 A1 | 7/2004 | Kim |
| 2004/0212054 A1 | 10/2004 | Maxwell et al. |
| 2004/0227225 A1 | 11/2004 | Fjelstad et al. |
| 2005/0013082 A1 | 1/2005 | Kawamoto et al. |
| 2005/0142835 A1 | 6/2005 | Ball et al. |
| 2005/0181545 A1 | 8/2005 | Grigg et al. |
| 2005/0242436 A1 | 11/2005 | Abe et al. |
| 2005/0253231 A1 | 11/2005 | Liu |
| 2006/0160346 A1 | 7/2006 | Hori |
| 2007/0069346 A1 | 3/2007 | Lin et al. |
| 2007/0148951 A1 | 6/2007 | Pang et al. |
| 2007/0200239 A1 | 8/2007 | Su |
| 2008/0102620 A1 | 5/2008 | Sakaguchi |
| 2008/0116588 A1 | 5/2008 | Van Kleef et al. |
| 2008/0182398 A1 | 7/2008 | Carpenter et al. |
| 2008/0265413 A1 | 10/2008 | Chou et al. |
| 2008/0298034 A1 | 12/2008 | Park et al. |
| 2008/0308934 A1 | 12/2008 | Alvarado et al. |
| 2009/0014869 A1 | 1/2009 | Vrtis et al. |
| 2009/0096079 A1 | 4/2009 | Park |
| 2009/0152721 A1 | 6/2009 | Huang et al. |
| 2009/0283903 A1 | 11/2009 | Park |
| 2010/0117231 A1 | 5/2010 | Lang et al. |
| 2010/0237491 A1 | 9/2010 | Park et al. |
| 2010/0237506 A1 | 9/2010 | Brunnbauer et al. |
| 2010/0283148 A1 | 11/2010 | Tsai et al. |
| 2011/0074041 A1 | 3/2011 | Leung et al. |
| 2011/0101519 A1 | 5/2011 | Hsiao et al. |
| 2011/0101526 A1 | 5/2011 | Hsiao et al. |
| 2011/0198753 A1 | 8/2011 | Holland |
| 2011/0227216 A1 | 9/2011 | Tseng et al. |
| 2011/0228464 A1 | 9/2011 | Guzek et al. |
| 2011/0248398 A1 | 10/2011 | Parvarandeh et al. |
| 2012/0032337 A1 | 2/2012 | Lu et al. |
| 2012/0049343 A1 | 3/2012 | Schulze et al. |
| 2012/0098120 A1 | 4/2012 | Yu et al. |
| 2012/0205813 A1 | 8/2012 | Lin et al. |
| 2012/0228765 A1 | 9/2012 | Alvarado et al. |
| 2013/0026622 A1 | 1/2013 | Chuang et al. |
| 2013/0062741 A1 | 3/2013 | Wu et al. |
| 2013/0062755 A1 | 3/2013 | Kuo et al. |
| 2013/0087892 A1 | 4/2013 | Yew et al. |
| 2013/0093079 A1 | 4/2013 | Tu et al. |
| 2013/0147030 A1 | 6/2013 | Chang et al. |
| 2013/0221522 A1 | 8/2013 | Chen et al. |
| 2014/0035148 A1 | 2/2014 | Chuang et al. |
| 2014/0113447 A1 | 4/2014 | Yew et al. |
| 2014/0377946 A1 | 12/2014 | Che et al. |

FOREIGN PATENT DOCUMENTS

| | | |
|---|---|---|
| JP | 02170548 | 7/1990 |
| KR | 1020100104377 | 9/2010 |
| TW | 201009963 | 3/2010 |
| WO | 2006008701 | 1/2006 |

* cited by examiner

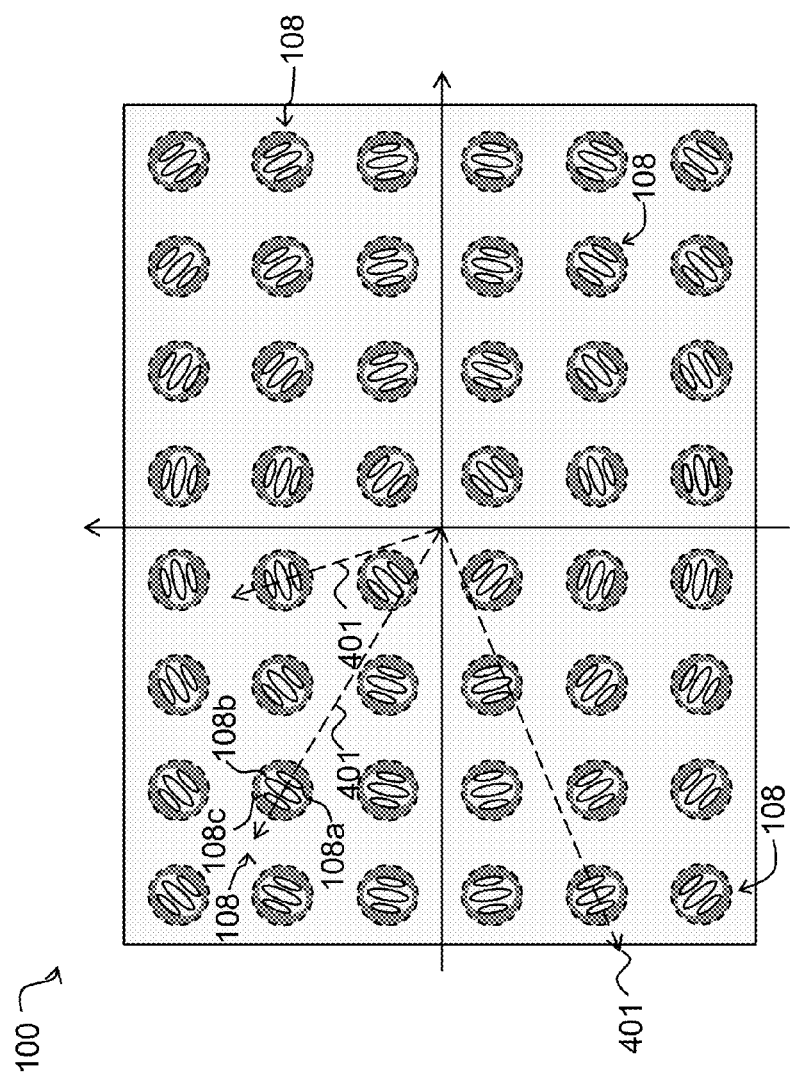

ELECTRICAL CONNECTIONS FOR CHIP SCALE PACKAGING

CROSS-REFERENCE TO RELATED APPLICATIONS

This application claims priority to as a continuation of co-pending and commonly assigned patent application Ser. No. 13/410,195, filed on Mar. 1, 2012, entitled, "Electrical Connection for Chip Scale Packaging," which application is hereby incorporated herein by reference. This application relates to the following co-pending and commonly assigned patent application Ser. No. 13/269,310, filed on Oct. 7, 2011, entitled, "Electrical Connection for Chip Scale Packaging," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLPs), in which integrated circuit die are packaged in packages that typically include a redistribution layer (RDL) that is used to fan out wiring for contact pads of the integrated circuit die so that electrical contact can be made on a larger pitch than contact pads of the die. Another type of packaging for semiconductor devices is referred to as a bump on trace (BOT) package. Solder bumps are formed on dies of a semiconductor wafer, and the dies are singulated. Die or "flip chips" are attached or soldered to traces on the BOT packages using a solder reflow process.

Generally, a semiconductor die may be connected to other devices external to the semiconductor die through a type of packaging utilizing solder bumps. The solder bumps may be formed by initially forming a layer of undercontact metallization on the semiconductor die and then placing solder onto the undercontact metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like.

However, the material that comprises the undercontact metallization is merely one more type of material placed onto a stack of many different materials, such as dielectric materials, metallization materials, etch stop materials, barrier layer materials, and other materials utilized in the formation of the semiconductor die. Each one of these different materials may have a unique coefficient of thermal expansion that is different from the other materials. This type of coefficient of thermal expansion mismatch can cause problems if the semiconductor die is subjected to elevated temperatures.

BRIEF DESCRIPTION OF THE DRAWINGS

For a more complete understanding of the various embodiments, and the advantages thereof, reference is now made to the following descriptions taken in conjunction with the accompanying drawings, in which:

FIGS. 4A through 4C illustrate layouts that may incorporate the post-passivation interconnect openings in accordance with embodiments;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the embodiments provide many applicable inventive concepts that can be embodied in a wide variety of specific contexts. The embodiments discussed are merely illustrative of specific ways to make and use the embodiments, and do not limit the scope of the embodiments.

The embodiments will be described with respect to embodiments in a specific context, namely a post-passivation interconnect underlying an undercontact metallization. The embodiments may also be applied, however, to other metallization layers of semiconductor devices. The embodiments describe structures and methods for making electrical connections that may be utilized in chip scale packaging and other applications.

Figure 1:
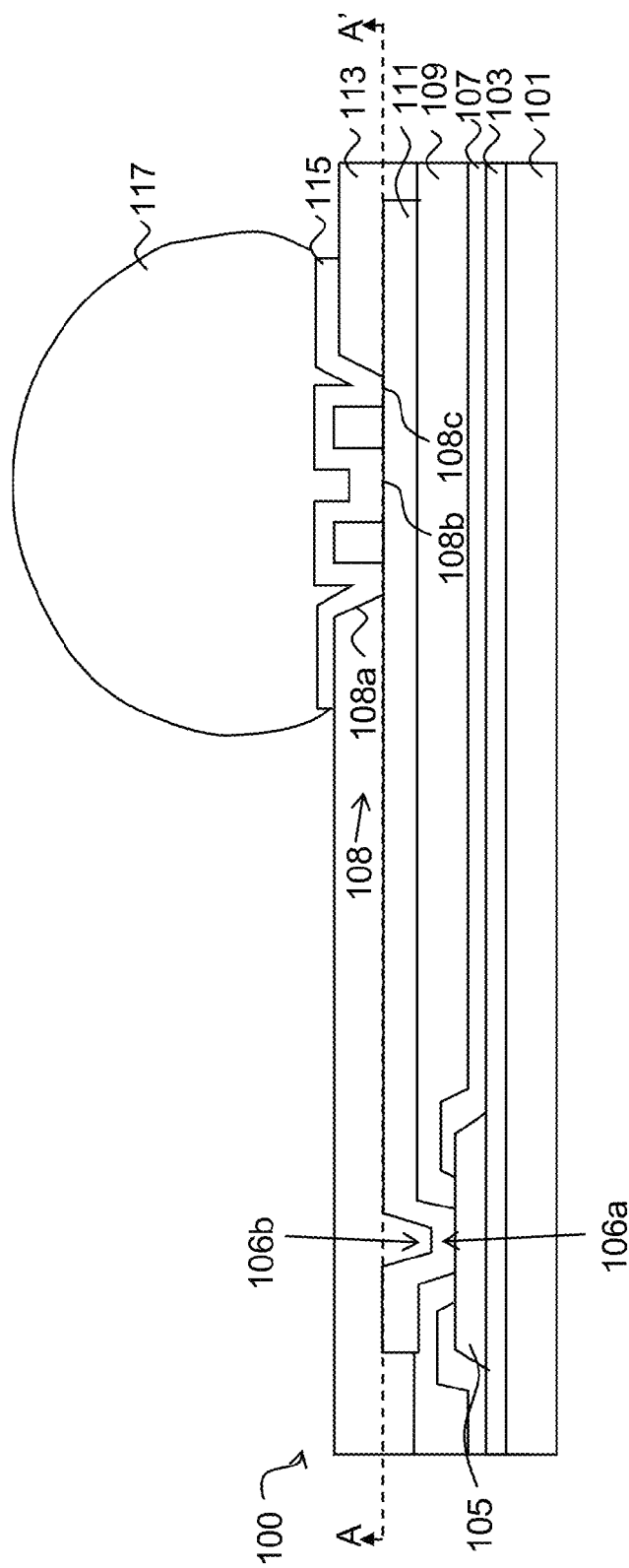
FIG. 1 illustrates a cross-sectional view of a post-passivation interconnect opening and undercontact metallization in accordance with an embodiment.

Referring first to FIG. 1, there is shown a portion of a semiconductor die 100 including a semiconductor substrate 101 with metallization layers 103, a contact pad 105, a first passivation layer 107, a second passivation layer 109, a post-passivation interconnect (PPI) 111, a PPI opening 108 comprising a plurality of apertures 108a, 108b, and 108c, a third passivation layer 113, an undercontact metallization (UCM) 115, and a connector 117. To manufacture the semiconductor device, the substrate 101 is first provided. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates, as examples.

Active devices (not shown) may be formed on the semiconductor substrate 101. As one of ordinary skill in the art will recognize, a wide variety of active devices such as capacitors, resistors, inductors and the like may be used to generate the desired structural and functional requirements of the design for the semiconductor die 100. The active devices may be formed using any suitable methods either within or else on the surface of the semiconductor substrate 101.

The metallization layers 103 are formed over the semiconductor substrate 101 and the active devices and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). Alternatively, other materials and processes may be used to fabricate the metallization layers 103. In one embodiment, there may be four layers of metallization separated from the semiconductor substrate 101 by at least one interlayer dielectric layer (ILD), but the precise number of metallization layers 103 is dependent upon the design of the semiconductor die 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown). Portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 µm and about 4 µm, such as about 1.45 µm. The contact pad 105 may alternatively comprise other dimensions.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, combinations of these, or the like. The first passivation layer 107 may be formed through a process such as chemical vapor deposition (CVD), although any other suitable process may alternatively be utilized. The first passivation layer 107 may have a thickness of between about 0.5 µm and about 5 µm, such as about 9.25 KÅ. Alternatively, the first passivation layer 107 may comprise other dimensions.

After the first passivation layer 107 has been formed, an opening 106a may be made through the first passivation layer 107 by removing portions of the first passivation layer 107 to expose at least a portion of the underlying contact pad 105. The opening allows 106a for contact between the contact pad 105 and the PPI 111. The opening 106a may be formed using a suitable photolithographic mask and etching process, although any suitable process to expose portions of the contact pad 105 may be used.

The second passivation layer 109 may be formed over the contact pad 105 and the first passivation layer 107. The second passivation layer 109 may be formed from a polymer such as polyimide. Alternatively, the second passivation layer 109 may be formed of a material similar to the material used as the first passivation layer 107, such as silicon oxides, silicon nitrides, combinations of these, and the like. The second passivation layer 109 may be formed to have a thickness of between about 2 µm and about 15 µm, such as about 5 µm. Alternatively, the second passivation layer 109 may comprise other dimensions.

After the second passivation layer 109 has been formed, an opening 106b may be made through the second passivation layer 109 by removing portions of the second passivation layer 109 to expose at least a portion of the underlying contact pad 105. The opening 106b allows for contact between the contact pad 105 and the PPI 111. The opening 106b may be formed using a suitable photolithographic mask and etching process, although any suitable process to expose portions of the contact pad 105 may be used.

After the contact pad 105 has been exposed, the PPI 111 comprising a conductive material may be formed to extend along the second passivation layer 109. The PPI 111 is also referred to herein, e.g., in the claims, as a conductive feature. The PPI 111 may be utilized as a redistribution layer to allow the UCM 115 that is electrically connected to the contact pad 105 to be placed in any desired location on the semiconductor die 100, instead of limiting the location of the UCM 115 to the region directly over the contact pad 105. In one embodiment, the PPI 111 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the PPI 111 is desired to be located.

After the photoresist has been formed and patterned, a conductive material, such as copper, may be formed on the seed layer through a deposition process such as plating. The conductive material may be formed to have a thickness of between about 1 µm and about 10 µm, such as about 5 µm, and a width along the substrate 101 of between about 5 µm and about 300 µm, such as about 15 µm. However, while the material and methods discussed are suitable to form the conductive material, these materials and dimensions are merely exemplary. Any other suitable materials, such as AlCu or Au, and any other suitable processes of formation, such as CVD or physical vapor deposition (PVD), may alternatively be used to form the PPI 111.

After the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

After the PPI 111 has been formed, the third passivation layer 113 may be formed to protect the PPI 111 and the other underlying structures. The third passivation layer 113 is also referred to herein as a post-passivation layer or a dielectric layer (e.g., in the claims). The third passivation layer 113, similar to the second passivation layer 109, may be formed from a polymer such as polyimide, or may alternatively be formed of a similar material as the first passivation layer 107 (e.g., silicon oxides, silicon nitrides, combinations of these, and the like). The third passivation layer 113 may be formed to have a thickness of between about 2 µm and about 15 µm, such as about 5 µm. Alternatively, the third passivation layer 113 may comprise other dimensions and materials.

After the third passivation layer 113 has been formed, a PPI opening 108 may be made through the third passivation layer 113 by removing portions of the third passivation layer 113 to expose at least a portion of the underlying PPI 111. The PPI opening 108 allows for contact between the UCM 115 and the PPI 111. The PPI opening 108 may be formed using a suitable photolithographic mask and etching process, although any suitable process to expose portions of the PPI 111 may alternatively be used.

The PPI opening 108 comprises a plurality of apertures 108a, 108b, and 108c in accordance with embodiments of the present disclosure. Three apertures 108a, 108b, and 108c are shown in FIGS. 1 through 3, FIGS. 4A through 4C, FIG. 5, and FIG. 6A. The PPI opening 108 may also comprise two apertures 108a, 108b, and 108c or four or more apertures 108a, 108b, and 108c in accordance with embodiments. For example, FIG. 6B shows an embodiment wherein the opening 108 comprises five apertures 108a, 108b, 108c, 108d, and 108e.

The plurality of apertures 108a, 108b, and 108c is elongated and may comprise an oval or elliptical shape, as shown in the figures. Alternatively, the plurality of apertures 108a, 108b, and 108c may comprise other elongated shapes, such as rectangular or trapezoidal, not shown. The plurality of apertures 108a, 108b, and 108c is also referred to herein as a plurality of elongated apertures. The plurality of apertures 108a, 108b, and 108c is oriented so that their elongated sides are substantially perpendicular to a line extending from a center of the semiconductor die (such as the substrate 101) that the plurality of apertures 108a, 108b, and 108c are formed on, to be described further herein.

After the PPI 111 has been exposed through the plurality of elongated apertures 108a, 108b, and 108c of the opening 108 in the third passivation layer 113, the UCM 115 may be formed that makes electrical contact with the PPI 111. The UCM 115 extends through or into the plurality of elongated apertures 108a, 108b, and 108c of the opening 108, for example. The UCM 115 may, for example, comprise an underbump metallization (UBM) and may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UCM 115. Any suitable materials or layers of material that may be used for the UCM 115 are fully intended to be included within the scope of the current application.

The UCM 115 may be created by forming each layer over the third passivation layer 113 and along the interior of the PPI opening 108 (e.g., along sidewalls and top surfaces of the plurality of elongated apertures 108a, 108b, and 108c in the third passivation layer 113 and over exposed portions of the PPI 111) through the third passivation layer 113. The forming of each layer may be performed using a plating process, such as electrochemical plating, although other processes of formation, such as sputtering, evaporation, or plasma-enhanced chemical vapor deposition (PECVD) process, may alternatively be used depending upon the desired materials. The UCM 115 may be formed to have a thickness of between about 0.7 μm and about 10 μm, such as about 5 μm. Alternatively, the UCM 115 may comprise other dimensions. After the desired layers have been formed, portions of the layers may then be removed through a suitable photolithographic masking and etching process to remove the undesired material and to leave the UCM 115 in a desired shape in a top view, such as a circular, octagonal, square, or rectangular shape, although any desired shape of UCM 115 may alternatively be formed.

Figure 6A:
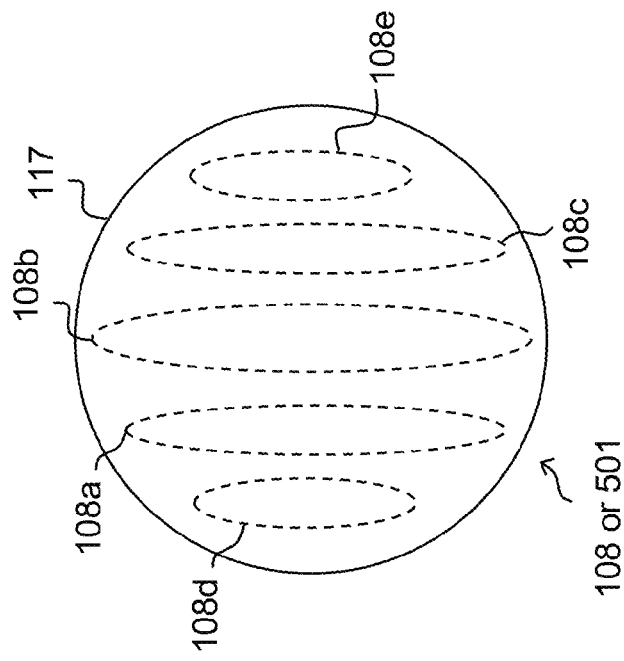
FIGS. 6A and 6B show top views of elongated and round solder balls, respectively, coupled to the post-passivation interconnect openings described herein.

The connector 117 may be a contact bump and may comprise a material such as tin, or other suitable materials, such as silver, lead-free tin, or copper. The connector 117 may comprise a solder ball or a controlled collapse chip connection (C4) bump in some embodiments. In an embodiment in which the connector 117 comprises a tin solder bump, the connector 117 may be formed by initially forming a layer of tin through such commonly used methods such as evaporation, electroplating, printing, solder transfer, ball placement, etc., to a thickness of about 100 μm. Alternatively, the connector 117 may comprise other dimensions. After a layer of tin has been formed on the structure, a reflow may be performed in order to shape the material into a desired bump shape, which may be elongated or circular, as shown in FIGS. 6A and 6B.

Figure 2:
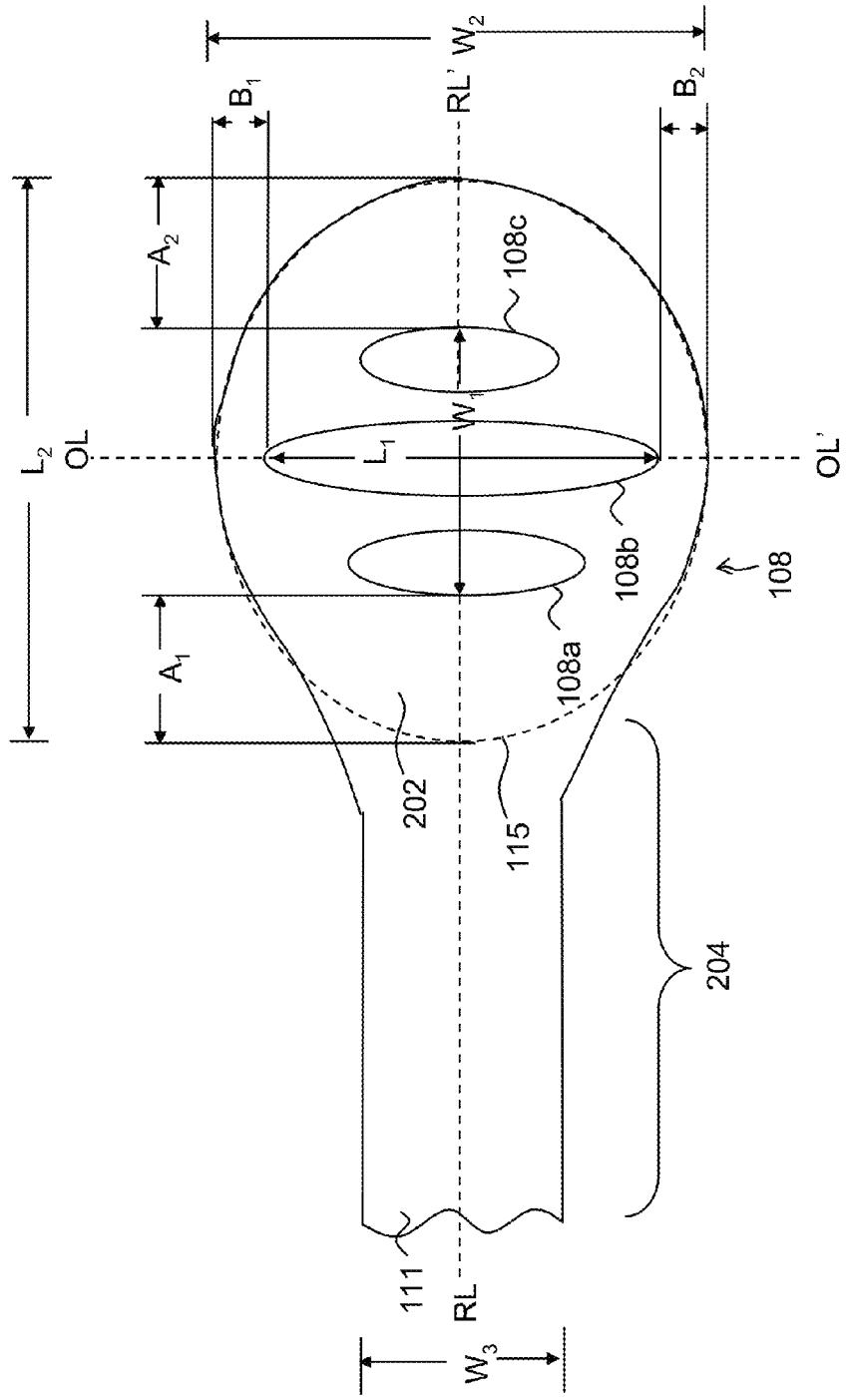
FIG. 2 illustrates a top view of the post-passivation interconnect opening and undercontact metallization of FIG. 1.

FIG. 2 illustrates a top view of the PPI opening 108 comprising the plurality of apertures 108a, 108b and 108c and the UCM 115 overlying the PPI 111 along line A-A' (in FIG. 1). For clarity, the connector 117, the third passivation layer 113, and the layers underlying the PPI 111 have been removed from FIG. 2 in order to more clearly illustrate features of the embodiments. Additionally in this view, the UCM 115 within the PPI opening 108 and the PPI opening 108 itself share substantially the same boundary; for example, the UCM 115 boundary is disposed about the plurality of apertures 108a, 108b, and 108c.

As can be seen in this top-down view, the PPI opening 108 (e.g., the longest one of the plurality of elongated apertures 108b) and the UCM 115 within the PPI opening 108 may have a first length $L_1$ along an opening longitudinal axis OL-OL' and a first width $W_1$ along an RDL longitudinal axis RL-RL'. The first length $L_1$ is also referred to herein as a first dimension, wherein the first dimension is aligned substantially perpendicular to a first direction of coefficient of thermal expansion mismatch. The first width $W_1$ comprises a dimension across the plurality of elongated apertures 108a, 108b, and 108c, for example. The first width $W_1$ is also referred to herein as a second dimension, wherein the second dimension is less than the first dimension $L_1$. The first width $W_1$ comprises a spacing across the plurality of elongated apertures 108a, 108b, and 108c, for example.

In one embodiment, the first length $L_1$ may be greater than the first width $W_1$, such that a larger amount of material from the third passivation layer 113 is located along the RDL longitudinal axis RL-RL' than with a circular opening. By placing a larger amount of the material of the third passivation layer 113 along the RDL longitudinal axis RL-RL', underlying layers (such as the metallization layers 103) may be shielded by the extra material from the third passivation layer 113 from stresses that may arise because of coefficient of thermal expansion mismatches along the RDL longitudinal axis RL-RL'. Additionally, by having the first width $W_1$ reduced in comparison to the first length $L_1$, the shielding provided by the extra material may be obtained along the first width $W_1$ without requiring a reduction in every dimension of the PPI opening 108 (such as the first length $L_1$), thereby helping to keep the contact resistance between the UCM 115 and the PPI 111 low while still allowing for the PPI opening 108 to help shield the underlying layers.

In one embodiment, the first length $L_1$ may be between about 50 μm and about 500 μm, such as about 200 μm, and the first width $W_1$ may be between about 30 μm and about 400 μm, such as about 150 μm. Alternatively, the first length $L_1$ and the first width $W_1$ may comprise other dimensions.

Furthermore, the additional third passivation material 113 disposed between the plurality of apertures 108a, 108b, and 108c of the opening 108 provides additional shielding for the underlying material layers. The plurality of elongated apertures 108a, 108b, and 108c may be spaced apart by about 50 μm or less in some embodiments, although alternatively, the elongated apertures 108a, 108b, and 108c may alternatively be spaced apart by different amounts and dimensions.

The PPI 111 may have an interconnect region 204 and a first region 202 that comprises a landing pad underlying the UCM 115 that has a larger dimension in each direction than the PPI opening 108 and effectively, from this top-down point of view, surrounds the PPI opening 108 and the UCM 115 within the PPI opening 108. The PPI 111 may have a second length $L_2$ in one direction (e.g., parallel to the RDL longitudinal axis RL-RL') and a second width $W_2$ in another direction (e.g., parallel to the opening longitudinal axis OL-OL'). In one embodiment, the second length $L_2$ may be the same as the second width $W_2$ or, alternatively, the second length $L_2$ may be larger than or smaller than the second width $W_2$. Additionally, the interconnect region 204 may have a third width $W_3$ less than the second width $W_2$, comprising between about 60 μm and about 550 μm, such as about 300 μm. Alternatively, the third width $W_3$ and the second width $W_2$ may comprise other dimensions.

As an example, in the embodiment shown in FIG. 2, the second length $L_2$ of the PPI 111 may extend beyond the PPI opening 108 by a first distance $A_1$, which may be between about 1 μm and about 200 μm, such as about 10 μm. In an opposite direction the second length $L_2$ of the PPI 111 may extend beyond the PPI opening 108 a second distance $A_2$, which may be between about 1 μm and about 200 μm, such as about 10 μm. As such, the second length $L_2$ of the PPI 111 may be substantially equal to the first width $W_1$ of the PPI opening 108 plus the first distance $A_1$ and the second distance $A_2$. Additionally, the second width $W_2$ of the first region 202 of the PPI 111 may extend a third distance $B_1$, which may be between about 1 μm and about 150 μm, such as about 10 μm. In an opposite direction parallel to the opening longitudinal axis OL-OL', the PPI 111 may extend a fourth distance $B_2$, which may be between about 1 μm and about 150 μm, such as about 10 μm. As such, the second width $W_2$ of the first region 202 of the PPI 111 may be substantially equal to the first length $L_1$ of the PPI opening 108 plus the third distance $B_1$ and the fourth distance $B_2$. Alternatively, the first distance $A_1$, the second distance $A_2$, the third distance $B_1$, and the fourth distance $B_2$ may comprise other dimensions.

In one embodiment, the first distance $A_1$ and the second distance $A_2$ may be substantially equal to each other, although alternatively they may not be equal to each other. Similarly, the third distance $B_1$ may be substantially the same as the fourth distance $B_2$, although alternatively they may be different distances as well. However, in one embodiment, the total of the sum of the first distance $A_1$ and the second distance $A_2$ is greater than the sum of the third distance $B_1$ and the fourth distance $B_2$. As such, the second length $L_2$ of the first region 202 of the PPI 111 may be the sum of the first width $W_1$ plus the first distance $A_1$ and the second distance $A_2$, while the second width $W_2$ of the first region 202 of the PPI 111 beneath the UCM 115 may be the sum of the first length $L_1$ plus the third distance $B_1$ and the fourth distance $B_2$.

By shaping the PPI opening 108 in the first region 202 such that extra material from the third passivation layer 113 is located along the RDL longitudinal axis RL-RL', the extra material from the third passivation layer 113 can effectively shield the underlying layers, such as the metallization layers 103 (see FIG. 1), that may have a combination of metals and extremely low-k dielectric layers, from the peeling stresses along the RDL longitudinal axis RL-RL' that can occur during thermal processing. In particular, the extra material from the third passivation layer 113 can effectively shield the underlying layers from stresses generated by thermal expansion mismatches between the layers. As such, delamination of the layers is less likely to occur, and the overall yield of the manufacturing processes may be increased.

Figure 3:
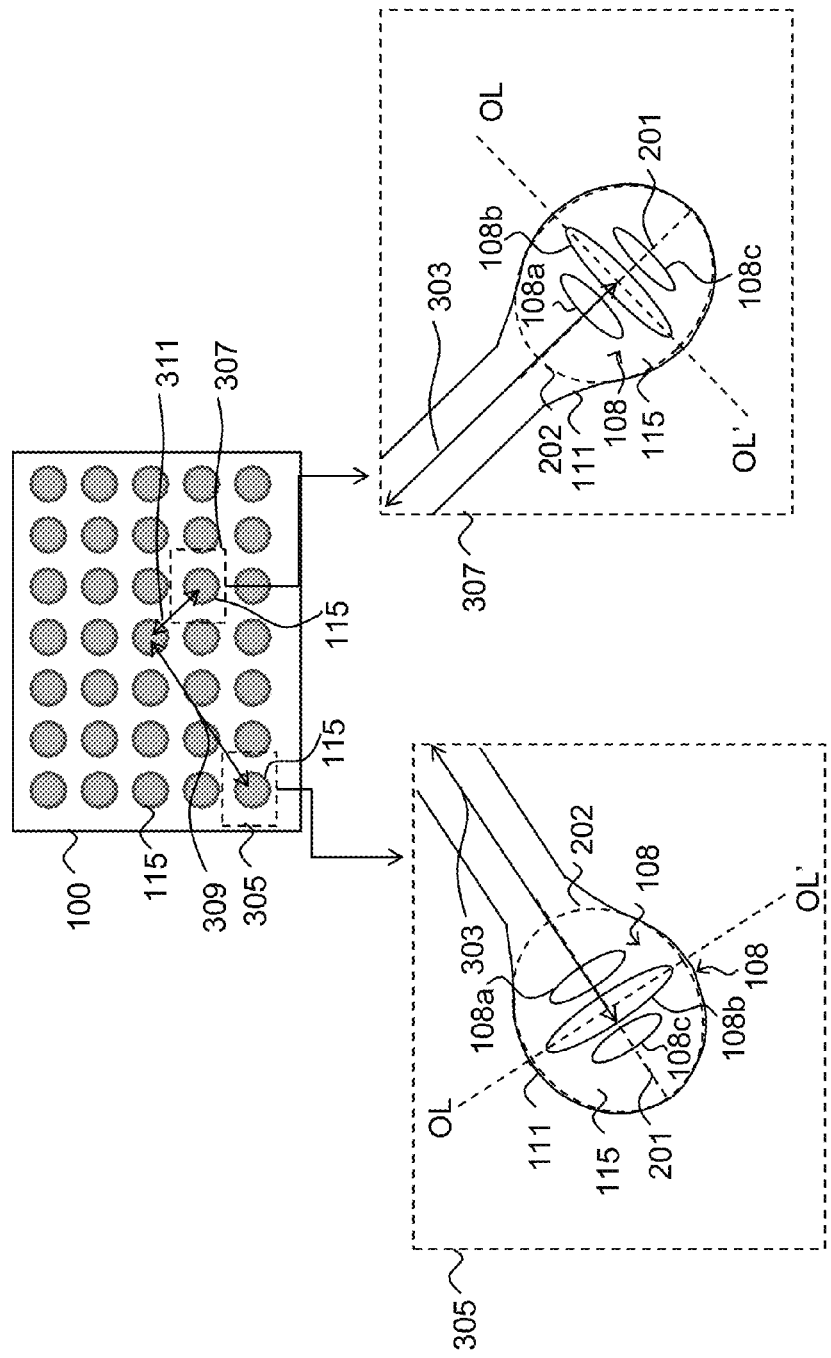
FIG. 3 illustrates a top-down view of an alignment of the post-passivation interconnect openings of FIG. 1.

FIG. 3 illustrates a top down view of the semiconductor die 100 with a plurality of UCMs 115 located thereon. The top down view illustrates only the UCMs 115 located on the die while a first example 305 and a second example 307 illustrate both the UCMs 115 as well as the PPIs 111 and the PPI openings 108. As illustrated, in one embodiment, the opening longitudinal axis OL-OL' of the PPI openings 108 beneath the UCMs 115 may be aligned substantially perpendicular to a direction of coefficient of thermal expansion mismatch (represented in FIG. 3 by line 303). The longitudinal axis OL-OL' is positioned perpendicular to a line 201 between a center of the plurality of elongated apertures 108a, 108b, and 108c of the PPI opening 108 and a center of the substrate 100. The longitudinal axis OL-OL' is aligned substantially perpendicular to the direction of coefficient of thermal expansion mismatch, 303, for the particular PPI opening 108. As an example only, on the semiconductor die 100 the direction of coefficient of thermal expansion mismatch 303 radiates outward from the center of the semiconductor die 100. As such, for each one of the UCMs 115 illustrated in FIG. 3, the direction of coefficient of thermal expansion mismatch 303 may be determined by drawing a line (e.g., first line 309 and second line 311 in FIG. 3) from the center of the semiconductor die 100 to the center of the individual UCMs 115. After the direction of coefficient of thermal expansion mismatch 303 for each of the individual UCMs 115 has been determined, the opening longitudinal axis OL-OL' of each of the PPIs 111 underlying each of the individual UCMs 115 may be aligned substantially perpendicular to the direction of coefficient of thermal expansion mismatch 303, e.g., along line 201.

Two examples of this are illustrated in FIG. 3, with the first example being represented by the dashed box 305 and the second example being represented by the dashed box 307. In the first example 305, the UCM 115 is located along an outer edge of the semiconductor die 100, and a first direction of coefficient of thermal expansion mismatch 303 may be determined by extending a first line 309 from the center of the semiconductor die 100 to a center of the UCM 115 within the dashed box 305. After the direction of coefficient of thermal expansion mismatch 303 has been determined for the UCM 115 within the dashed box 305, the opening longitudinal axis OL-OL' of the PPI opening 108 (e.g., of the plurality of elongated apertures 108a, 108b, and 108c) may be aligned perpendicular to the first direction of coefficient of thermal expansion mismatch 303, thereby helping to shield the underlying layers from stresses caused by differences in the coefficients of thermal expansion.

In the second example 307, similar to the first example 305, a second direction of coefficient of thermal expansion mismatch 303 may be determined by extending a second line 311 from the center of the semiconductor die 100 to a center of the UCM 115 within the dashed box 307. After the second direction of coefficient of thermal expansion mismatch 303 has been determined for the UCM 115 within the dashed box 307, the opening longitudinal axis OL-OL' of the underlying PPI opening 108 (e.g., along a length of a longest elongated aperture 108b) may be aligned substantially perpendicular to the second direction of coefficient of thermal expansion mismatch 303, thereby also helping to shield the underlying layers from stresses caused by differences in the coefficients of thermal expansion.

However, as one of ordinary skill in the art will recognize, the above described method of determining the direction of coefficient of thermal expansion mismatch 303 is not the only method that may be used. Alternative methods, such as testing the semiconductor die 100 and/or experimentally measuring the actual direction of coefficient of thermal expansion mismatch 303 under thermal processes may alternatively be utilized. These methods and any other suitable method may alternatively be used and are fully intended to be included within the scope of the present embodiments.

Figure 4C:
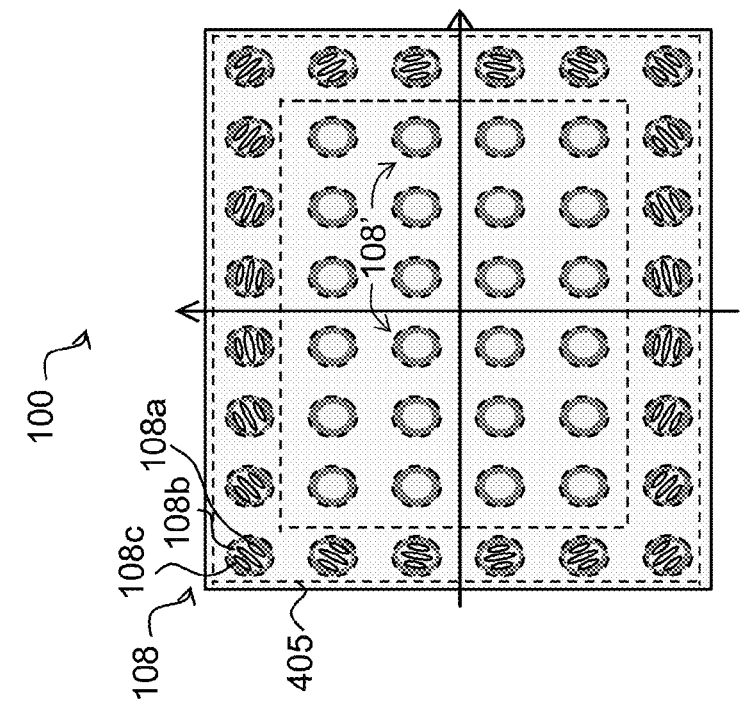
Figure 4B:
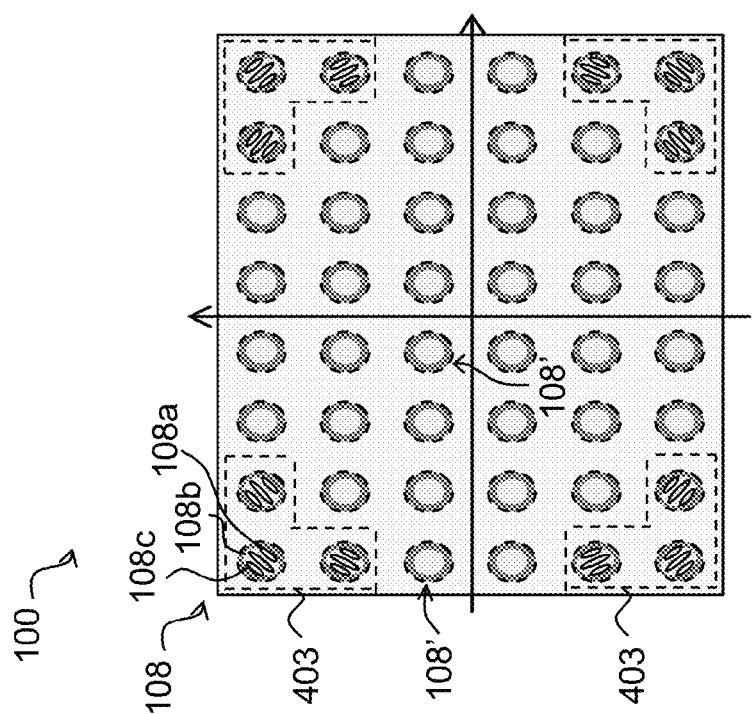

FIGS. 4A through 4C illustrate different embodiments in which the PPI openings 108 may be aligned relative to the direction of coefficient of thermal expansion mismatch 303. In the embodiment illustrated in a top view in FIG. 4A, all of the PPI openings 108 comprise the plurality of elongated apertures 108a, 108b, and 108c that are located on the semiconductor die 100, and all of the PPI openings 108 are individually aligned to be substantially perpendicular to the direction of coefficient of thermal expansion mismatch 303 (as illustrated by the three dashed lines 401). Each of the PPI openings 108 is aligned differently depending upon its location on the semiconductor die 100 and its location relative to the center of the semiconductor die 100.

FIG. 4B illustrates a top view of an embodiment in which only those PPI openings 108 located within corners regions 403 of the semiconductor die 100 are aligned substantially perpendicular to the direction of coefficient of thermal expansion mismatch 303. In such an embodiment, the remainder of the PPI openings 108' in a central region of the die 100 and along the edges of the die 100 may comprise circular openings, for example, while the PPI openings 108 located within the corner regions 403 comprise elongated apertures 108a, 108b, and 108c that are aligned substantially perpendicular to the direction of coefficient of thermal expansion mismatch 303. In one embodiment, the corner regions 403 may each comprise one PPI opening 108 located in the corners of the semiconductor die 100. The corner regions 403 may also optionally include an adjacent PPI opening 108 on each side of the corner PPI openings 108 that is also located along an edge of the semiconductor die 100 and is aligned substantially perpendicular to its direction of coefficient of thermal expansion mismatch, as shown in FIG. 4B. Alternatively the PPI openings 108 in the corner regions 403 may comprise any suitable shape or arrangement to help prevent delamination of the underlying layers, for example.

FIG. 4C illustrates another embodiment in which only those PPI openings 108 along an outer edge 405 of the semiconductor die 100 are aligned perpendicular to the direction of coefficient of thermal expansion mismatch 303, while the remainder of the PPI openings 108' within an interior region of the substrate 101 may comprise circular openings, for example. In this embodiment, the outer edge 405 may comprise an edge that is one PPI opening 108 wide. Alternatively, the outer edge 405 that may have a thickness greater than one PPI opening 108 wide, such as two or more PPI openings 108 wide; for example, the outer edge 405 may include two rows of the PPI openings 108 described herein (not shown).

Figure 5:
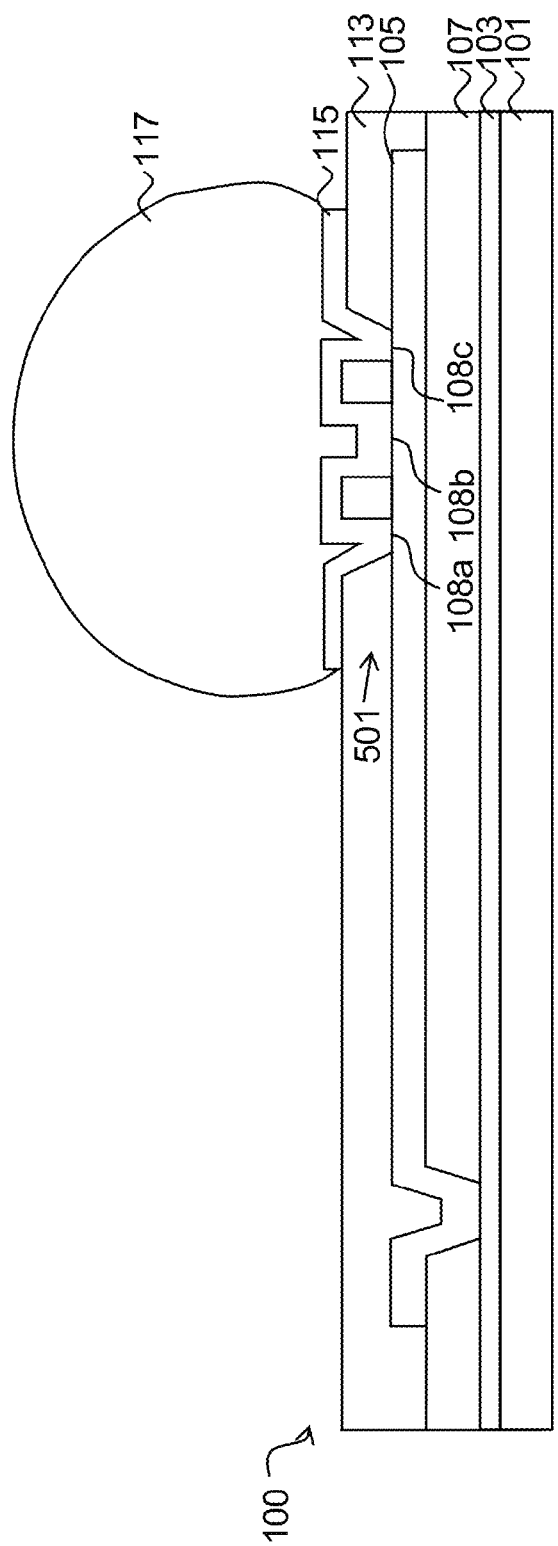
FIG. 5 illustrates another embodiment in which the post-passivation interconnect opening exposes a contact pad.
Figure 6B:
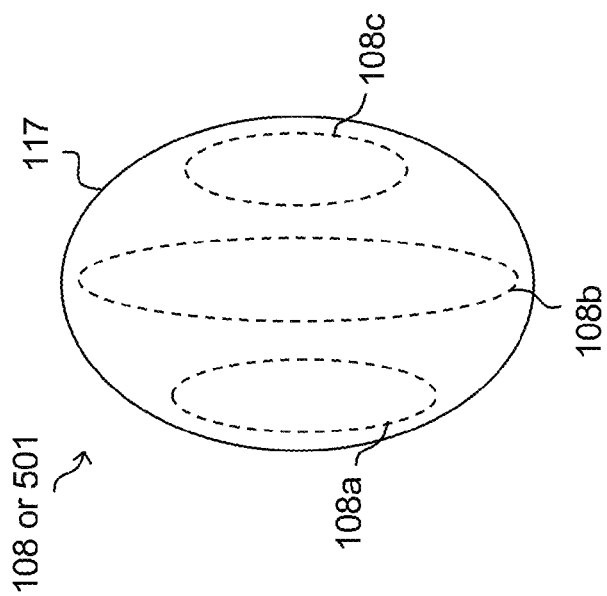

FIG. 5 illustrates another embodiment in which the second passivation layer 109 and the PPI 111 are not included in the structure; e.g., the second passivation layer 109 and the PPI 111 shown in the previous embodiment are not formed on the substrate 101 and the metallization layers 103. Rather, the first passivation layer 107 may be formed over the metallization layers 103 prior to the formation of the contact pad 105. In one embodiment, the first passivation layer 107 may be formed as described above with respect to FIG. 1, although other materials and methods may alternatively be utilized.

After the first passivation layer 107 has been formed, the first passivation layer 107 may be patterned using a suitable photolithographic masking and etching process to expose a portion of the metallization layers 103. After the portion of the metallization layers 103 has been exposed, the contact pad 105 may be formed through the first passivation layer 107 using similar materials and processes described above with respect to FIG. 1. Additionally in this embodiment, the contact pad 105 may be formed to extend along the first passivation layer 107, functioning as a redistribution layer and replacing the need for the PPI 111, which may not be formed in this embodiment. The contact pad 105 is also referred to herein, e.g., in the claims, as a conductive feature.

After the contact pad 105 has been formed to extend along the first passivation layer 107, the third passivation layer 113 may be formed over the contact pad 105 using materials and processes similar to those described above with respect to FIG. 1, and the third passivation layer 113 may be patterned to form a contact pad opening 501 through the third passivation layer 113. The contact pad opening 501 may be formed and shaped similar to the formation and shaping of the PPI opening 108 described above with respect to FIGS. 1 through 3 and FIGS. 4A through 4C. For example, the contact pad opening 501 includes a plurality of elongated apertures 108a, 108b, and 108c that are shaped to have the first length $L_1$ and the first width $W_1$ as described above with respect to FIG. 2. Additionally, the first length $L_1$ of the contact pad opening 501 (e.g., of the longest elongated aperture 108b) may also be aligned substantially perpendicular to a direction of coefficient of thermal expansion mismatch of the substrate 101.

By forming the contact pad opening 501 to expose the contact pad 105, the contact pad opening 501 may be utilized to help shield the underlying layers at the level of the contact pad 105. Additionally, the second passivation layer 109 and the PPI 111 may not be utilized in this embodiment, and may not be included in the semiconductor device. Without these additional layers of materials, the overall manufacturing process may be simplified and made more efficient.

After the formation of the PPI opening 108 or the contact pad opening 501 that includes the plurality of apertures 108a, 108b, and 108c that are elongated, the UCM 115 is formed over the opening 108 or 501. The UCM 115 is electrically coupled to the conductive features, e.g., to the PPI 111 through the plurality of elongated apertures 108a, 108b, and 108c of the PPI opening 108 in FIG. 1, or to the contact pad 105 through the plurality of elongated apertures 108a, 108b, and 108c of the contact pad opening 501 in FIG. 5. A connector 117 is formed over each UCM 115. The connectors 117 may comprise solder balls that may be elongated or circular, depending on the overall shape of the plurality of apertures 108a, 108b, and 108c (and also apertures 108d and 108e shown in FIG. 6B). FIGS. 6A and 6B show top views of elongated and round solder balls, respectively, coupled to the post-passivation interconnect openings 108 or contact pad openings 501 described herein.

Embodiments of the present disclosure include semiconductor devices having the novel openings 108 and 501 that include the plurality of elongated apertures 108a, 108b, 108c, 108d, and 108e. Embodiments also include methods of manufacturing the semiconductor devices.

In accordance with one embodiment of the present disclosure, a semiconductor device includes a post-passivation layer disposed over a substrate, the substrate having a first direction of coefficient of thermal expansion mismatch. The semiconductor device includes a first opening through the post-passivation layer, the first opening comprising a plurality of elongated apertures. A longest of the plurality of elongated apertures comprises a first dimension, wherein the first dimension is aligned substantially perpendicular to the first direction of coefficient of thermal expansion mismatch.

In accordance with another embodiment, a semiconductor device includes a dielectric layer disposed over a substrate and a first opening through the dielectric layer. The first opening includes a plurality of elongated apertures, a longest of the plurality of elongated apertures comprising a first dimension. A spacing across the plurality of elongated apertures comprises a second dimension that is less than the first dimension. The first dimension is aligned substantially perpendicular to a first line extending between a center of the substrate and a center of the plurality of elongated apertures of the first opening. An undercontact metallization extends into the plurality of elongated contacts of the first opening.

In accordance with yet another embodiment, a method of manufacturing a semiconductor device includes providing a substrate, the substrate having a first direction of coefficient of thermal expansion mismatch. The method includes forming a passivation layer over the substrate and forming a first opening through the passivation layer. The first opening includes a plurality of elongated apertures, a longest of the plurality of elongated apertures comprising a first dimension. A spacing across the plurality of elongated apertures comprises a second dimension that is less than the first dimension, and the first dimension is aligned substantially perpendicular to the first direction of coefficient of thermal expansion mismatch. The method includes forming an undercontact metallization over the first opening.

Although the present embodiments and their advantages have been described in detail, it should be understood that various changes, substitutions and alterations can be made herein without departing from the spirit and scope of the embodiments as defined by the appended claims. For example, the precise shape of the corner regions or outer edge may be modified, or the methodology for determining the direction of coefficient of thermal expansion mismatch may be changed, while still remaining with the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a substrate;
   a first layer formed on the substrate, the first layer having a first coefficient of thermal expansion;
   a second layer formed on the substrate, the first layer and the second layer having a mismatch between their respective coefficients of thermal expansion, the mismatch causing stress in a first direction along a major plane of the device; and
   a post-passivation layer formed on the substrate, the passivation layer having a plurality of elongated apertures extending therethrough, a longest one of the plurality of elongated apertures having a major axis extending in a second direction along the major plane of the device, the second direction being substantially perpendicular to the first direction.

2. The semiconductor device of claim 1, further comprising a conductor atop the post-passivation layer and extending through each of the plurality of elongated apertures to electrically contact an underlying post-passivation interconnect.

3. The semiconductor device of claim 1, wherein the first direction extends in a straight line from the center of the substrate to a midpoint of the longest one of the plurality of elongated apertures.

4. The semiconductor device according to claim 1, wherein the elongated apertures each has a shape selected from the group consisting of an oval, an ellipse, a rectangle, and a trapezoid.

5. The semiconductor device according to claim 1, further comprising a contact pad formed on the substrate and an interconnect on the substrate and in electrical connection with the contact pad.

6. The semiconductor device according to claim 5, wherein the post-passivation layer covers the interconnect and wherein elongated apertures expose portions of the interconnect.

7. The semiconductor device according to claim 1, further comprising an undercontact metallization extending into the elongated apertures.

8. A semiconductor device for shielding underlying layers from stresses generated by thermal expansion mismatches between device layers, the device comprising:
   a plurality of device layers including a post-passivation layer, at least two of the device layers having coefficient of thermal expansion mismatch that generates stress extending in a first direction; and
   a plurality of elongated apertures in the post-passivation layer, a longest one of the plurality of elongated apertures having a major axis extending substantially perpendicular to the first direction.

9. The semiconductor device according to claim 8, wherein the elongated apertures expose portions of an interconnect under the post-passivation layer.

10. The semiconductor device according to claim 9, further comprising an undercontact metallization extending atop the post-passivation layer and extending into the elongated apertures to electrically contact the interconnect.

11. The semiconductor device of claim 10, further comprising a connector attached to the undercontact metallization.

12. The semiconductor device according to claim 8, wherein the first direction extends in a straight line from the center of the device to a midpoint of the longest one of the plurality of elongated apertures.

13. The semiconductor device according to claim 8, wherein the elongated apertures each has a shape selected from the group consisting of an oval, an ellipse, a rectangle, and a trapezoid.

14. The semiconductor device of claim 8, wherein each elongated aperture of the plurality of elongated apertures has a major axis extending substantially perpendicular to the first direction.

15. The semiconductor device of claim 11, wherein the interconnect electrically connects the connector to a contact pad on a surface of the device.

16. A method of manufacturing a semiconductor device comprising:
   providing a plurality of device layers including a post-passivation layer, at least two of the device layers having a first direction of coefficient of thermal expansion mismatch;

etching through the post-passivation layer a first elongated aperture having a first length extending in a second direction substantially perpendicular to the first direction;

etching through the post-passivation layer a plurality of second apertures, each having a second length, shorter than the first length, extending in the second direction; and filling the first elongated aperture and the plurality of second apertures with a conductor.

17. The method claim 16, wherein the steps of etching through the post-passivation layer a first elongated aperture and etching through the post-passivation layer a plurality of second apertures occur simultaneously.

18. The method of claim 16, wherein the step of providing a plurality of device layers including a passivation layer, at least two of the device layers having a first direction of coefficient of thermal expansion mismatch includes:

forming a plurality of metallization layers over a substrate;

forming a contact pad over a topmost one of the metallization layer;

forming a first passivation layer over the plurality of metallization layers and the contact pad;

patterning the first passivation layer to form an opening exposing the contact pad;

forming a patterned second passivation layer over the first exposing contact pad; and forming an interconnect on the second passivation layer and in electrical contact with the contact pad.

19. The method of claim 16, further comprising mounting a connector to the conductor.

20. The method of claim 16, wherein the first direction of coefficient of thermal expansion mismatch extends along a top major surface of the device in a line from a center of the top major surface to the periphery of the top major surface of the device.

* * * * *